United States Patent
Oda

(10) Patent No.: US 10,431,439 B2
(45) Date of Patent: Oct. 1, 2019

(54) TANTALUM SPUTTERING TARGET

(71) Applicant: JX Nippon Mining & Metals Corporation, Tokyo (JP)

(72) Inventor: Kunihiro Oda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 19 days.

(21) Appl. No.: 14/917,519

(22) PCT Filed: Sep. 26, 2014

(86) PCT No.: PCT/JP2014/075548
§ 371 (c)(1),
(2) Date: Mar. 8, 2016

(87) PCT Pub. No.: WO2015/050041
PCT Pub. Date: Apr. 9, 2015

(65) Prior Publication Data
US 2016/0217983 A1   Jul. 28, 2016

(30) Foreign Application Priority Data

Oct. 1, 2013  (JP) .................................. 2013-206580

(51) Int. Cl.
| C23C 14/34 | (2006.01) |
| H01J 37/34 | (2006.01) |
| C23C 14/14 | (2006.01) |
| C22C 27/02 | (2006.01) |

(52) U.S. Cl.
CPC .......... *H01J 37/3426* (2013.01); *C22C 27/02* (2013.01); *C23C 14/14* (2013.01); *C23C 14/3414* (2013.01); *H01J 37/3423* (2013.01)

(58) Field of Classification Search
CPC .................................................. H01J 37/3426
See application file for complete search history.

(56) References Cited

U.S. PATENT DOCUMENTS

| 6,331,233 | B1 | 12/2001 | Turner |
| 6,348,139 | B1 | 2/2002 | Shah et al. |
| 6,676,728 | B2 | 1/2004 | Han et al. |
| 7,081,148 | B2 | 7/2006 | Koenigsmann et al. |
| 7,101,447 | B2 | 9/2006 | Turner |
| 7,156,963 | B2 | 1/2007 | Oda |
| 7,485,198 | B2 * | 2/2009 | Michaluk ............ C22C 27/02  148/422 |
| 7,699,948 | B2 | 4/2010 | Oda |
| 7,716,806 | B2 | 5/2010 | Oda |
| 7,740,717 | B2 | 6/2010 | Oda |
| 7,892,367 | B2 | 2/2011 | Oda |
| 7,998,287 | B2 | 8/2011 | Wickersham, Jr. et al. |
| 8,172,960 | B2 | 5/2012 | Oda et al. |
| 8,177,947 | B2 | 5/2012 | Miyashita |
| 8,231,745 | B2 | 7/2012 | Wickersham, Jr. et al. |
| 8,425,696 | B2 | 4/2013 | Oda et al. |
| 8,747,633 | B2 | 6/2014 | Nakashima et al. |
| 9,085,819 | B2 | 7/2015 | Senda et al. |
| 2002/0100683 | A1 * | 8/2002 | Mohan ............ B22D 19/14  204/298.13 |
| 2011/0266145 | A1 | 11/2011 | Fukushima et al. |
| 2012/0031756 | A1 | 2/2012 | Fukushima et al. |
| 2012/0037501 | A1 | 2/2012 | Fukushima et al. |
| 2012/0061672 | A1 | 3/2012 | O'Rourke et al. |
| 2012/0132523 | A1 | 5/2012 | Hagihara et al. |
| 2012/0267236 | A1 | 10/2012 | Nakashima et al. |
| 2013/0081938 | A1 * | 4/2013 | Mizuno ............ C23C 14/35  204/192.12 |
| 2013/0092534 | A1 | 4/2013 | Senda et al. |
| 2013/0098759 | A1 | 4/2013 | Senda et al. |
| 2014/0242401 | A1 | 8/2014 | Senda et al. |
| 2015/0064056 | A1 | 3/2015 | Nagatsu et al. |
| 2015/0279637 | A1 | 10/2015 | Senda et al. |
| 2015/0329959 | A1 | 11/2015 | Senda et al. |
| 2015/0348765 | A1 | 12/2015 | Senda et al. |
| 2016/0208377 | A1 | 7/2016 | Oda |

FOREIGN PATENT DOCUMENTS

| EP | 0902102 A1 | 3/1999 |
| JP | 2000-212678 A | 8/2000 |
| JP | 2002-060934 A | 2/2002 |

* cited by examiner

*Primary Examiner* — Jason Berman
(74) *Attorney, Agent, or Firm* — Howson & Howson LLP

(57) ABSTRACT

A tantalum sputtering target containing niobium and tungsten as essential components in a total amount of 1 massppm or more and less than 10 massppm, and having a purity of 99.9999% or higher excluding niobium, tungsten and gas components. Provided is a high purity tantalum sputtering target comprising a uniform and fine structure which is adjusted to be within an optimal range and which enables deposition of a uniform film at a high deposition rate in a stable manner.

1 Claim, No Drawings

TANTALUM SPUTTERING TARGET

BACKGROUND

The present invention relates to a high purity tantalum sputtering target comprising a uniform structure and which enables uniform sputtering at a high deposition rate in a stable manner.

In recent years, the sputtering method for forming films from metals, ceramics and other materials has been used in numerous fields such as electronics, corrosion resistant materials and ornaments, catalysts, as well as in the manufacture of cutting/polishing materials and abrasion resistant materials.

While the sputtering method itself is a well-known method in the foregoing fields, recently, particularly in the electronics field, a tantalum sputtering target suitable for forming films of complex shapes, forming circuits or forming barrier films is in demand.

Generally speaking, this tantalum target is manufactured by repeating the forging and annealing (heat treatment) of an ingot or billet formed by performing electron beam melting and casting to a tantalum raw material, and thereafter performing rolling and finish processing (machining, polishing, etc.) thereto in order to process the ingot or billet into a target.

In this kind of production process, the forging performed to the ingot or billet will destroy the cast structure, disperse or eliminate the pores and segregations, and, by further performing annealing thereto, recrystallization will occur, and the densification and strength of the structure are improved to obtain the target.

The molten and cast ingot or billet generally has a primary crystal grain size of 50 mm or more. As a result of subjecting the ingot or billet to forging and recrystallization annealing, the cast structure is destroyed, and generally uniform and fine (100 µm or less) crystal grains can be obtained.

Meanwhile, when sputtering is performed using a target produced as described above, it is said that the recrystallized structure of the target becomes even finer and more uniform, more uniform deposition is possible with a target in which the crystal orientation is aligned toward a specific direction, and a film with low generation of arcing and particles and stable characteristics can be obtained. Thus, measures are being taken for achieving a finer and more uniform recrystallized structure and aligning the crystal orientation toward a specific direction in the production process of the target (for example, refer to Patent Document 1 and Patent Document 2).

Moreover, disclosed is a high purity Ta target for forming a TaN film to be used as a barrier layer against a Cu wiring which is obtained by containing 0.001 to 20 ppm of an element selected among Ag, Au and Cu as an element having self-sustained discharge characteristics, causing the total amount of Fe, Ni, Cr, Si, Al, Na, and K as impurity elements to be 100 ppm or less, and using a high purity Ta in which the value obtained by subtracting such impurity elements is within the range of 99.99 to 99.999% (refer to Patent Document 3).

Nevertheless, when reviewing these Patent Documents, there is no disclosure to the effect that the inclusion of specific elements realizes a finer structure and thereby stabilizes the plasma.

Moreover, since the wiring width is becoming even narrower with the state-of-the-art semiconductor devices in recent years, Ta or TaN films that are used as the barrier layer of a Cu wiring are demanded of having an even thinner film thickness (ultra-thin film) while maintaining barrier characteristics that are equal to, or better than, conventional technologies.

In order to meet the foregoing demands, desired is a high purity material from which impurities, which inhibit the adhesion of the film, are reduced as much as possible, but a Ta material having a purity of 6N had a drawback in that it is difficult to obtain a fine and uniform structure since crystal grains would grow easily when forging is performed for refining the crystal grain size or when recrystallization is performed via heat treatment to the strain from the plastic working process that is introduced in the rolling process. Furthermore, when a target having this kind of coarse crystal structure is sputtered, there is a problem in that the uniformity of the deposited film will deteriorate.

In light of the above, the present applicant previously filed an application for a tantalum sputtering target containing tungsten and other elements as essential components in an amount of 1 massppm or more and 100 massppm or less, and having a purity or 99.9985% or higher as a result of discovering that, by adding trace amounts of components that have a limited effect on the film characteristics, it is possible to achieve a fine and uniform crystal grain size while maintaining a high purity (refer to Patent Documents 4 to 6).

Nevertheless, when the foregoing targets are used; that is, when a target having an ultra-fine crystal structure caused by excessive refinement is sputtered, in certain cases major problems were indicated to the effect that the deposition rate becomes slow and high-speed sputtering cannot be performed in a stable and uniform manner, and the productivity would considerably deteriorate.

PRIOR ART DOCUMENTS

Patent Documents

[Patent Document 1] Japanese Translation of PCT International Application Publication No. 2002-518593

[Patent Document 2] U.S. Pat. No. 6,331,233

[Patent Document 3] Japanese Patent Application Publication No. 2002-60934

[Patent Document 4] International Publication No. 2011/018971

[Patent Document 5] International Publication No. 2010/134417

[Patent Document 6] International Publication No. 2011/018970

SUMMARY

An object of the present invention is to provide a high purity tantalum sputtering target capable of maintaining the high purity of tantalum and comprising a uniform and fine structure which is adjusted to be within an optimal range and which enables uniform sputtering at a high deposition rate in a stable manner by adding specific elements.

As a result of intense research for achieving the foregoing object, the present inventors discovered that it is possible to adjust the crystal structure to be within an optimal range and obtain a high purity tantalum sputtering target comprising a uniform structure and which enables uniform sputtering at a high deposition rate in a stable manner by adding specific elements in trace amounts.

Based on the foregoing discovery, the present invention provides:
1) A tantalum sputtering target containing niobium and tungsten as essential components in a total amount of 1 massppm or more and less than 10 massppm, and having a purity of 99.9999% or higher excluding niobium, tungsten and gas components;
2) The tantalum sputtering target according to 1) above, wherein an average crystal grain size is 50 μm or more and 150 μm or less; and
3) The tantalum sputtering target according to 2) above, wherein variation of the crystal grain size is 20% or less.

The present invention yields a superior effect of being able to provide a high purity tantalum sputtering target capable of maintaining the high purity of tantalum and comprising a uniform and fine structure which is adjusted to be within an optimal range and which enables uniform sputtering at a high deposition rate in a stable manner by adding niobium and tungsten as essential components in trace amounts. High-speed sputtering is extremely effective from the perspective of productivity since the deposition time can be shortened.

DETAILED DESCRIPTION

Refining of Tantalum Raw Material

The tantalum (Ta) used in the present invention can be refined, for instance, as follows. Foremost, a tantalum raw material mineral is pulverized, the pulverized powder is dissolved in hydrofluoric acid, and then solvent extraction is performed to obtain a tantalum solution. Subsequently, potassium fluoride and potassium chloride are added to the tantalum solution, and potassium fluorotantalate is precipitated and isolated. The potassium fluorotantalate is thereafter subject to smelting reduction with metal sodium to obtain high purity tantalum powder. Moreover, the tantalum powder may also be subject to deoxidization treatment with magnesium as needed.

With the thus obtained high purity tantalum, the impurity content excluding gas components was less than 1 massppm, and the purity was 99.9999 mass % or higher. Of course, since the impurities can also be eliminated in the subsequent electron beam melting process, for instance, it is also possible to use tantalum having a purity level of 4N (99.99%) or higher. Moreover, needless to say, it is also possible to use high purity tantalum that is refined using other methods.

Preparation of Tantalum Ingot

The tantalum ingot used in the present invention can be produced, for instance, based on the following process. Foremost, trace amounts of niobium (Nb) powder and tungsten (W) powder are added to and mixed with the tantalum powder obtained as described above, and the obtained mixed powder is molded into a compact with a metallic mold.

Specifically, for instance, 0.6 g of niobium powder and tungsten powder may be added to 600 kg of tantalum powder. Here, in order to uniformly disperse the added powder, it would be effective to mix the powders for a long period of time in a mixer, or agitate the molten metal in the melting/refining process described later.

Moreover, as another method of adding niobium and tungsten, a tantalum alloy containing niobium and tungsten may be formed into fine lines, and the fine lines may be inserted into the molten metal raw material so as to continuously and uniformly supply niobium and tungsten. In the foregoing case, since the niobium and tungsten are already alloyed, the activity thereof is lower than powder, and it is possible to inhibit the niobium and tungsten from scattering and decreasing during the electron beam melting process. Since the raw material tantalum alloy can be easily obtained via small-scale melting such as EB button melting, the tantalum alloy can be stretched and formed into fine lines for use.

Moreover, as another method of adding niobium and tungsten, for instance, a facet obtained by cutting a tantalum alloy containing 100 ppm of niobium and tungsten may be pulverized, and the pulverized powder may be added to and mixed with tantalum powder. Here, the amount required as the facet relative to 600 kg of tantalum powder is 60 g, and the uniformity can be improved by pulverizing the facet before being added to the tantalum powder.

Furthermore, tantalum pellets containing niobium and tungsten subject to button melting via EB can also be embedded at equal intervals in the briquette of the press mold so as to add the niobium and tungsten at an equivalent rate during the introduction of the raw material to be melted via EB, and this is effective for uniformly adding niobium and tungsten. Here, it is desirable to supply the pellets at equal intervals and equal amounts during the accumulation of the molten metal by estimating the formation range of the molten metal of EB. If additives having a volume that is greater than the volume of the molten metal are added or the interval of the addition is great, there will be sections that are cooled and solidified without being added with niobium and tungsten. Thus, it is desirable to intermittently and continuously add additives having a small volume.

Subsequently, the obtained compact is introduced and filled in the raw material introduction part of the electron beam melting furnace, the raw material introduction part is subject to vacuum pumping, the raw material is thereafter transferred to the main body of the electron beam melting furnace, and then melted and refined with an electron beam (EB). The melting temperature is preferably near 3020° C. (3020 to 3500° C.), which is the melting point of tantalum. While niobium (melting point: 2469° C., boiling point: 4927° C.) and tungsten (melting point: 3420° C., boiling point: 5555° C.) will not evaporate during the melting process, volatile impurities can be eliminated via the melting process. With the thus obtained high purity tantalum ingot, the content of all impurities excluding gas components was less than 1 massppm.

Subsequently, the liquefied tantalum molten metal is cooled to room temperature in order to prepare a high purity tantalum ingot. Note that the foregoing electron beam melting is one example of the melting/refining means, and there will be no problem in using other melting/refining means so long as the object of the present invention can be achieved.

Preparation of Sputtering Target

To illustrate an example of producing the tantalum sputtering target of the present invention, the following method may be adopted. Foremost, the tantalum ingot obtained as described above is subject to a series of processing steps including annealing-forging, rolling, annealing (heat treatment) and finish processing.

Specifically, for instance, the foregoing ingot is subject to—extend Forging—(first) annealing at a temperature of 1373 K to 1673 K—(first) cold forging—(second) recrystallization annealing at a temperature between the recrystallization start temperature and 1373 K—(second) cold forging—(third) recrystallization annealing at a temperature between the recrystallization start temperature and 1373 K—(first) cold (hot) rolling—(fourth) recrystallization annealing at a temperature between the recrystallization start temperature and 1373 K—(as needed, second) cold (hot) rolling—(as needed, fifth) recrystallization annealing at a temperature between the recrystallization start temperature and 1373 K—finish processing to obtain a sputtering target material.

The forging or rolling performed to the ingot will destroy the cast structure, disperse or eliminate the pores and segregations, and, by further performing annealing thereto, recrystallization will occur, and the densification, refinement and strength of the structure can be improved by repeating the foregoing cold forging or cold rolling and recrystallization annealing. While the recrystallization annealing may only be performed once in the foregoing forming process, the structural defects can be reduced as much as possible by repeating such recrystallization annealing twice. Moreover, the cold (hot) rolling and recrystallization annealing performed between the recrystallization start temperature and a temperature of 1373 K may be repeated or may be performed only for one cycle. The final target shape is obtained by subsequently performing finish processing such as machining and polishing.

While the present invention can produce the tantalum target based on the foregoing production process, this production method is merely an exemplification. Moreover, since the present invention is not an invention of a production process, the target can be produced based on other processes as a matter of course, and this invention covers all of the targets produced based on such other processes.

Meanwhile, conventionally, a tantalum material having an inferior purity level of 4N5 to 4N was sometimes used as a sputtering target for obtaining a uniform film, but a material having a purity level of 6N is now being used to leverage the characteristics of a tantalum material, and this kind of high purity raw material exhibits superior adhesion as a barrier layer of a copper wiring, and also exhibits extremely high reliability since it hardly contains any impurity components that may induce defects, and a tantalum target made from this kind of material acquired support from the market.

Moreover, an ingot that is used as the foregoing material has a uniform and fine structure (500 μm or less) since the cast structure thereof is destroyed via forging and recrystallization annealing, and comprises a crystal structure in which the crystal orientation is aligned toward a specific direction. When a target obtained from the foregoing ingot is sputtered, it is said that high-speed deposition is enabled, generation of arcing and particles is reduced, and it is thereby possible to obtain a film comprising stable characteristics.

In light of the above, conventional methods adopted measures for attaining a fine and uniform recrystallized structure and aligning the crystal orientation in a specific direction in the production process of a target in order to obtain favorable deposition characteristics.

However, when the foregoing high purity (6N level) material is used, crystal grains would grow extremely easily near the recrystallization temperature and it is difficult to obtain fine crystals even when attempts are made to obtain uniform and fine crystal grains by destroying the primary crystal grains through plastic working processes such as forging and rolling and introducing the strain from such plastic working processes.

Since the wiring width is becoming even narrower with the state-of-the-art semiconductor devices in recent years, tantalum that is used as the barrier layer of a copper wiring is demanded of being an ultra-thin film that is even thinner than conventionally, and is also demanded of superior barrier characteristics that are equal to, or better than, conventional technologies. In order to meet the foregoing demands, desired is a high purity material from which impurity components, which inhibit the adhesion of the film, are reduced as much as possible, but a high purity tantalum material having a purity of 6N had a drawback in that it is difficult to obtain a fine and uniform structure as described above.

In light of the foregoing circumstances, as a result of further intense study, the present inventors discovered that the advantage of the material having a high purity can be maintained and a fine and uniform crystal grain size can be achieved by adding niobium (Nb) and tungsten (W), which hardly affect the film properties, within a range of at least maintaining the purity level of the material to be 5N, and this discovery led to the achievement of the present invention.

Note that attempts of reducing, as much as possible, impurities in the tantalum raw material powder which is refined via electron beam melting have been attained over a long period of time, and high purity tantalum having a purity level of 6N can now be obtained. However, it is not yet possible to control the purity of the raw material powder in order to obtain an ingot having the intended purity.

In other words, what is important with the tantalum sputtering target of this invention is that niobium and tungsten are contained as essential components in a total amount of 1 massppm or more and 10 massppm or less in tantalum having a purity of 99.9999% or higher excluding niobium, tungsten and gas components.

1 massppm as the lower limit of the niobium and tungsten content is a numerical value for exhibiting the foregoing effect, and 10 massppm as the upper limit of the niobium and tungsten content is the upper limit for maintaining the effect of the present invention. When the niobium and tungsten content falls below the foregoing lower limit, it becomes difficult to control the recrystallized grain size, and the coarsened crystal grains cause the deterioration in the uniformity of the sputtered film. When the niobium and tungsten content exceeds the foregoing upper limit, the crystal structure becomes excessively refined, a part in which the recrystallization is incomplete will arise, and this will consequently induce the significant deterioration in the sputter rate. Thus, 10 massppm is set as the upper limit of the niobium and tungsten content.

The inclusion of niobium and tungsten contributes to the formation of a uniform and fine structure of an optimal target, and it is thereby possible to stabilize the plasma, increase the deposition rate, and improve the uniformity of the sputtered film. Moreover, since the plasma stabilization during sputtering can also be realized during the initial stage of sputtering, the burn-in time can be shortened.

In the foregoing case, the purity of tantalum needs to be high purity; that is, 99.9999% or higher. Here, gas components such as oxygen, hydrogen, carbon, nitrogen and sulfur can be excluded. Generally speaking, it is difficult to exclude gas components unless a special method is employed, and gas components are difficult to eliminate during the refining in the production process under normal circumstances. Thus, gas components are excluded from the purity of tantalum of the present invention.

As described above, niobium and tungsten realize the uniform and fine structure of tantalum, but the inclusion of other metal components, oxides, nitrides, carbides and other ceramics is harmful, and cannot be tolerated. This is because these impurity elements are considered to inhibit the effect of niobium and tungsten. In addition, these impurities are clearly different from niobium and tungsten, and it is difficult to achieve a uniform crystal grain size of the tantalum target, and these impurities do not contribute to the stabilization of the sputtering characteristics.

The tantalum sputtering target of the present invention contains, as a more preferred range, niobium and tungsten as essential components each in an amount of 1 massppm or more and 5 massppm or less, and has a purity of 99.9999% or higher excluding niobium, tungsten and gas components.

Furthermore, with the tantalum sputtering target of the present invention, the variation of the niobium and tungsten content in the target is desirably 30% or less.

So as long as the inclusion of an appropriate amount of niobium and tungsten yields the function (property) of forming a uniform and fine structure of the tantalum sputtering target, the uniform dispersion of niobium will contribute even more strongly to the uniform and fine structure of the target. Needless to say, it is easy to achieve the above with a standard production process, but it is necessary to take note of causing the variation of the niobium and tungsten content in the target to be 20% or less, and to have a clear intent to achieve the same.

The variation of the niobium and tungsten content in the target is measured, in the case of a disk-shaped target, by taking 5 points (center point, ½ points of the radius, and points in the outer periphery or its vicinity) on 2 orthogonal diameter lines, and analyzing the niobium and tungsten content at a total of 9 points {10 points−center point (since the center point is common, it is counted as one point)}. Subsequently, the variation is calculated at the respective points based on the formula of {(maximum value−minimum value)/(maximum value+minimum value)}×100.

Moreover, the tantalum sputtering target of the present invention desirably has an average crystal grain size of 50 μm or more and 150 μm or less.

Conventionally, the recognition was that uniform deposition is possible by prescribing the upper limit of the average grain size of the crystal grain size of the target material and keeping the average grain size below the upper limit. However, as a result of continuing to conduct a detailed study regarding the structure and deposition characteristics of a tantalum target, it was discovered that, in order to realize high-speed and stable deposition, the average crystal grain size is desirably 50 μm or more. Meanwhile, in order to obtain uniform film characteristics, it was discovered that the average crystal grain size is desirably 150 μm or less.

While the crystal grain size can be refined by adding an appropriate amount of niobium and tungsten in a standard production process, it is necessary to take note of causing the average crystal grain size to be 50 μm or more and 150 μm or less, and to have a clear intent to achieve the same.

Moreover, the variation of the crystal grain size is desirably 20% or less.

With this kind of target structure, it is thereby possible to stabilize the plasma, increase the deposition rate, and improve the uniformity of the sputtered film. Moreover, since the plasma stabilization during sputtering can also be realized during the initial stage of sputtering, the present invention additionally yields the effect of being able to shorten the burn-in time.

The variation of the average crystal grain size of the tantalum target is measured, in the case of a disk-shaped target, by taking 5 points (center point, ½ points of the radius, and points in the outer periphery or its vicinity) on 2 orthogonal diameter lines, and measuring the crystal grain size of tantalum at a total of 9 points {10 points−center point (since the center point is common, it is counted as one point)}. Subsequently, the variation of the crystal grain size is calculated at the respective points based on the formula of {(maximum value−minimum value)/(maximum value+minimum value)}×100.

EXAMPLES

The present invention is now explained in detail with reference to the Examples. These Examples are merely illustrative, and the present invention shall in no way be limited thereby. In other words, the present invention covers the other modes and modifications included in the technical concept of this invention.

Example 1

A raw material obtained by adding 5 massppm of niobium and 4 massppm of tungsten to tantalum having a purity of 99.9999% or higher was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ. Note that the recrystallization annealing temperature can be adjusted within a temperature range of 1400 to 1500 K, and similar effects can be obtained.

Subsequently, the obtained material was subject to cold rolling and recrystallization annealing at 1173 K, and then subject to finish processing to obtain a target material having a thickness of 10 mm and a diameter of 450 mmφ.

The average crystal grain size of the target was 50 μm, and the variation of the crystal grain size was 20%. Moreover, the variation of the niobium and tungsten content was 20%. The results are shown in Table 1.

Note that the halfway and last cold working and recrystallization annealing processes were adjusted to achieve the foregoing average crystal grain size and variation of the crystal grain size. While the average crystal grain size and variation will also change depending on the additive amount of niobium and tungsten, they can also be adjusted based on the processing conditions.

The thus obtained target was mounted on a sputtering device, and then sputtered. The sputtering conditions were as follows; namely, input power of 15 kw and Ar gas flow of 8 sccm. After performing pre-sputtering at 75 kWhr, a film was deposited on a silicon wafer having a diameter of 12 inches for 15 seconds. Since the sheet resistance depends on the film thickness, the distribution of the sheet resistance in the wafer was measured to check the distribution status of the film thickness. Specifically, the sheet resistance of 49 points on the wafer was measured to calculate the standard deviation (σ) thereof.

The results are similarly shown in Table 1. As evident from Table 1, this Example shows that the sheet resistance distribution is small (1.0%); that is, the film thickness distribution is small. Moreover, the deposition rate of sputtering was measured, and the result was 8 Å/sec.

are similarly shown in Table 1. As evident from Table 1, this Example shows that the sheet resistance distribution is small (1.3%); that is, the film thickness distribution is small. Moreover, the deposition rate of sputtering was measured, and the result was 9.5 Å/sec.

TABLE 1

| | Additive amount of Nb (massppm) | Additive amount of W (massppm) | Other metals | Purity of Ta (excluding Nb, W and gas components) | Average crystal grain size (µm) | Variation of average crystal grain size (%) | Variation of Nb and W content (%) | Deposition rate (Å/sec) | Sheet resistance distribution (%) |
|---|---|---|---|---|---|---|---|---|---|
| Example 1 | 5 | 4 | Less than 1 massppm | 99.9999% or higher | 50 | 20 | 20 | 8 | 1.0 |
| Example 2 | 1 | 5 | Less than 1 massppm | 99.9999% or higher | 120 | 10 | 30 | 9.5 | 1.3 |
| Example 3 | 5 | 1 | Less than 1 massppm | 99.9999% or higher | 100 | 10 | 30 | 9 | 1.5 |
| Example 4 | 1 | 1 | Less than 1 massppm | 99.9999% or higher | 140 | 8 | 50 | 10 | 2.0 |
| Comparative Example 1 | 10 | 10 | 10 massppm | 99.999% | 30 | 30 | 10 | 6 | 1.0 |
| Comparative Example 2 | 15 | 5 | Less than 1 massppm | 99.9999% or higher | 25 | 30 | 10 | 5.5 | 1.0 |
| Comparative Example 3 | 5 | 15 | Less than 1 massppm | 99.9999% or higher | 35 | 30 | 10 | 6 | 1.0 |
| Comparative Example 4 | 0.5 | 0.05 | Less than 1 massppm | 99.9999% or higher | 200 | 15 | 50 | 10 | 5.0 |

Example 2

A raw material obtained by adding 1 massppm of niobium and 5 massppm of tungsten to tantalum having a purity of 99.9999% or higher was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ.

The average crystal grain size of the target was 120 µm, and the variation of the crystal grain size was 10%. Moreover, the variation of the niobium and tungsten content was 30%. The results are similarly shown in Table 1.

Note that the halfway and last cold working and recrystallization annealing processes were adjusted to achieve the foregoing average crystal grain size and variation of the crystal grain size. While the average crystal grain size and variation will also change depending on the additive amount of niobium and tungsten, they can also be adjusted based on the processing conditions.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results Example 3

A raw material obtained by adding 5 massppm of niobium and 1 massppm of tungsten to tantalum having a purity of 99.9999% or higher was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ.

The average crystal grain size of the target was 100 µm, and the variation of the crystal grain size was 10%. Moreover, the variation of the niobium and tungsten content was 30%. The results are similarly shown in Table 1.

Note that the halfway and last cold working and recrystallization annealing processes were adjusted to achieve the foregoing average crystal grain size and variation of the crystal grain size. While the average crystal grain size and variation will also change depending on the additive amount of niobium and tungsten, they can also be adjusted based on the processing conditions.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results are similarly shown in Table 1. As evident from Table 1, this Example shows that the sheet resistance distribution is small (1.5%); that is, the film thickness distribution is small. Moreover, the deposition rate of sputtering was measured, and the result was 9 Å/sec.

Example 4

A raw material obtained by adding 1 massppm of niobium and 1 massppm of tungsten to tantalum having a purity of 99.9999% or higher was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ. The average crystal grain size of the target was 140 μm, and the variation of the crystal grain size was 8%. Moreover, the variation of the niobium content was 50%. The results are similarly shown in Table 1.

Note that the halfway and last cold working and recrystallization annealing processes were adjusted to achieve the foregoing average crystal grain size and variation of the crystal grain size. While the average crystal grain size and variation will also change depending on the additive amount of niobium and tungsten, they can also be adjusted based on the processing conditions.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results are similarly shown in Table 1. As evident from Table 1, this Example shows that the sheet resistance distribution is small (2.0%); that is, the film thickness distribution is small. Moreover, the deposition rate of sputtering was measured, and the result was 10 Å/sec.

Comparative Example 1

A raw material obtained by adding 10 massppm of niobium and 10 massppm of tungsten to tantalum having a purity of 99.999% was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ. The average crystal grain size of the target was 30 μm, and the variation of the crystal grain size was 30%. Moreover, the variation of the niobium and tungsten content was 10%. The results are similarly shown in Table 1.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results are similarly shown in Table 1. As evident from Table 1, this Comparative Example shows that the sheet resistance distribution is small (1.0%); that is, the film thickness distribution is small, but when the deposition rate of sputtering was measured, and the result was 6 Å/sec, and the deposition rate was slow in comparison to the Examples.

Comparative Example 2

A raw material obtained by adding 15 massppm of niobium and 5 massppm of tungsten to tantalum having a purity of 99.999% was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ. The average crystal grain size of the target was 25 μm, and the variation of the crystal grain size was 30%. Moreover, the variation of the niobium and tungsten content was 10%. The results are similarly shown in Table 1.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results are similarly shown in Table 1. As evident from Table 1, this Comparative Example shows that the sheet resistance distribution is small (1.0%); that is, the film thickness distribution is small, but when the deposition rate of sputtering was measured, and the result was 5.5 Å/sec, and the deposition rate was slow in comparison to the Examples.

Comparative Example 3

A raw material obtained by adding 5 massppm of niobium and 15 massppm of tungsten to tantalum having a purity of 99.999% was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ. The average crystal grain size of the target was 35 μm, and the variation of the crystal grain size was 30%. Moreover, the variation of the niobium and tungsten content was 10%. The results are similarly shown in Table 1.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results are similarly shown in Table 1. As evident from Table 1, this Comparative Example shows that the sheet resistance distribution is small (1.0%); that is, the film thickness distribution is small, but when the deposition rate of sputtering was measured, and the result was 6 Å/sec, and the deposition rate was slow in comparison to the Examples.

Comparative Example 4

A raw material obtained by adding 0.5 massppm of niobium and 0.05 massppm of tungsten to tantalum having a purity of 99.999% was subject to electron beam melting, and then subject to casting to obtain an ingot having a length of 1000 mm and a diameter of 200 mmφ.

Subsequently, after performing extend forging to the obtained ingot at room temperature, the ingot was cut and then subject to recrystallization annealing at a temperature of 1500 K. It was thereby possible to obtain a material having a thickness of 120 mm and a diameter of 130 mmφ.

Subsequently, the obtained material was subject to extend forging and upset forging at room temperature once again, and recrystallization annealing was performed thereto again at a temperature of 1480 K. The foregoing forging and heat treatment processes were repeated once again to obtain a material having a thickness of 120 mm and a diameter of 130 mmφ.

Subsequently, the obtained material was subject to cold rolling and recrystallization annealing and then subject to finish processing to obtain a target material having a thickness of 10 mm and a diameter of 450 mmφ. The average crystal grain size of the target was 200 μm, and the variation of the crystal grain size was 15%. Moreover, the variation of the niobium and tungsten content was 50%. The results are similarly shown in Table 1.

The thus obtained target was mounted on a sputtering device, and then sputtered. The sputtering conditions were the same as Example 1. The distribution of the sheet resistance in the wafer was measured to check the distribution status of the film thickness. The measurement method of the sheet resistance was the same as Example 1. The results are similarly shown in Table 1. As evident from Table 1, this Comparative Example shows that the sheet resistance distribution is great (5.0%); that is, the film thickness distribution is great. Moreover, when the deposition rate of sputtering was measured, and the result was 10 Å/sec.

Based on the above, it was discovered that the deposition rate becomes slow when the total additive amount of niobium and tungsten to tantalum having a purity of 99.9999% or higher exceeds 10 massppm, and the excessive addition of niobium and tungsten is undesirable. Moreover, when the total additive amount of niobium and tungsten is less than 1 massppm, it was discovered that the crystal grain size rapidly becomes coarse and the variation also increases, and this is also undesirable.

By realizing a tantalum sputtering target containing niobium and tungsten as essential components in a total amount of 1 massppm or more and less than 10 massppm, and having a purity of 99.9999% or higher excluding niobium, tungsten and gas components, the present invention yields a superior effect of being able to provide a high purity tantalum sputtering target comprising a uniform and fine structure which is adjusted to be within an optimal range and which enables deposition of a uniform film at a high deposition rate in a stable manner.

Moreover, since the increase in the deposition rate yields the effect of being able to shorten the deposition time, from the perspective of productivity, the target of the present invention is useful in the electronics field, particularly as a target suitable for forming films of complex shapes, forming circuits or forming barrier films.

The invention claimed is:

1. A disk-shaped tantalum sputtering target having a recrystallized structure and a diameter of 450 mmφ and containing niobium and tungsten as essential components each in an amount of 1 massppm or more and 5 massppm or less, and having a purity of 99.9999% or higher excluding niobium, tungsten and gas components, wherein an average crystal grain size of the tantalum sputtering target is 50 μm or more and 150 μm or less, variation of the crystal grain size is 20% or less, and variation of contents of the niobium and tungsten in the tantalum sputtering target is 30% or less, and wherein the variation of the crystal grain size is defined as a percentage determined by measuring the crystal grain size of the tantalum sputtering target at a total of 9 points, including a center point of the target, four points at half radius of the target, and four points adjacent an outer periphery of the target, and by calculating a variation thereof with a formula of ((maximum value−minimum value)/(maximum value+minimum value))×100.

* * * * *